United States Patent
Lee et al.

(10) Patent No.: US 7,512,024 B2
(45) Date of Patent: Mar. 31, 2009

(54) HIGH-SPEED MEMORY DEVICE EASILY TESTABLE BY LOW-SPEED AUTOMATIC TEST EQUIPMENT AND INPUT/OUTPUT PIN CONTROL METHOD THEREOF

(75) Inventors: Jae-wook Lee, Yongin-si (KR); Hoe-ju Chung, Yongin-si (KR); Woo-seop Kim, Yeongdeungpo-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/859,824

(22) Filed: Sep. 24, 2007

(65) Prior Publication Data

US 2008/0106950 A1    May 8, 2008

(30) Foreign Application Priority Data

Nov. 8, 2006    (KR) ..................... 10-2006-0110182

(51) Int. Cl.
*G11C 29/00* (2006.01)
(52) U.S. Cl. ........................... 365/201; 365/63; 714/718
(58) Field of Classification Search ................... 365/201
See application file for complete search history.

(56) References Cited

U.S. PATENT DOCUMENTS

| | | | |
|---|---|---|---|
| 5,617,531 A * | 4/1997 | Crouch et al. ................. 714/30 |
| 5,675,545 A * | 10/1997 | Madhavan et al. ........... 365/201 |
| 6,148,413 A * | 11/2000 | Pascucci et al. ................. 714/8 |
| 6,272,657 B1 | 8/2001 | Dhaliwal |
| 6,807,109 B2 * | 10/2004 | Tomishima ............ 365/189.05 |
| 6,829,738 B2 * | 12/2004 | Stabenau ..................... 714/718 |
| 6,901,541 B2 * | 5/2005 | Antosh et al. ............... 714/718 |
| 7,177,211 B2 * | 2/2007 | Zimmerman ................ 365/201 |
| 7,328,381 B2 * | 2/2008 | Jeddeloh et al. ............. 714/718 |
| 7,395,476 B2 * | 7/2008 | Cowell et al. ............... 714/734 |
| 7,414,917 B2 * | 8/2008 | Ruckerbauer et al. .. 365/233.13 |
| 2004/0158675 A1 * | 8/2004 | Hirose ........................ 711/115 |

FOREIGN PATENT DOCUMENTS

| JP | 2004192790 A | 7/2004 |
|---|---|---|
| KR | 1998016286 A | 5/1998 |

* cited by examiner

*Primary Examiner*—Son L Mai
(74) *Attorney, Agent, or Firm*—Volentine & Whitt, PLLC

(57) ABSTRACT

The present invention provides a high-speed memory device that can be easily tested using the existing low-speed Automatic Test Equipment (ATE). In an embodiment of the invention, a memory device includes two channels. During normal communications with a host, one channel is used for bi-directional communications with a host. But during a test mode, a first channel is used to communicate with the ATE in one direction, and a second channel is used to communicate with the ATE in the opposite direction. The present invention also provides a memory module and a method for controlling the high-speed memory device.

20 Claims, 7 Drawing Sheets

HIGH-SPEED MEMORY DEVICE EASILY TESTABLE BY LOW-SPEED AUTOMATIC TEST EQUIPMENT AND INPUT/OUTPUT PIN CONTROL METHOD THEREOF

CROSS-REFERENCE TO RELATED PATENT APPLICATION

This application claims the benefit of Korean Patent Application No. 10-2006-0110182, filed on Nov. 8, 2006, in the Korean Intellectual Property Office, the disclosure of which is incorporated herein in its entirety by reference.

BACKGROUND OF THE INVENTION

1. Field of the Invention

The present invention relates to a high-speed memory device configured to perform bidirectional communication, and more particularly but without limitation, to a high-speed memory device configured to perform bidirectional communication that can be easily tested using the existing low-speed automatic test equipment (ATE) and an input/output pin control method thereof.

2. Description of the Related Art

Recent high-speed semiconductor memory devices have used a bidirectional pulse width modulation (PWM) communication method to control internal registers. A bidirectional communication method is generally referred to as an OOB (Out Of Band) communication method.

Figure 1:
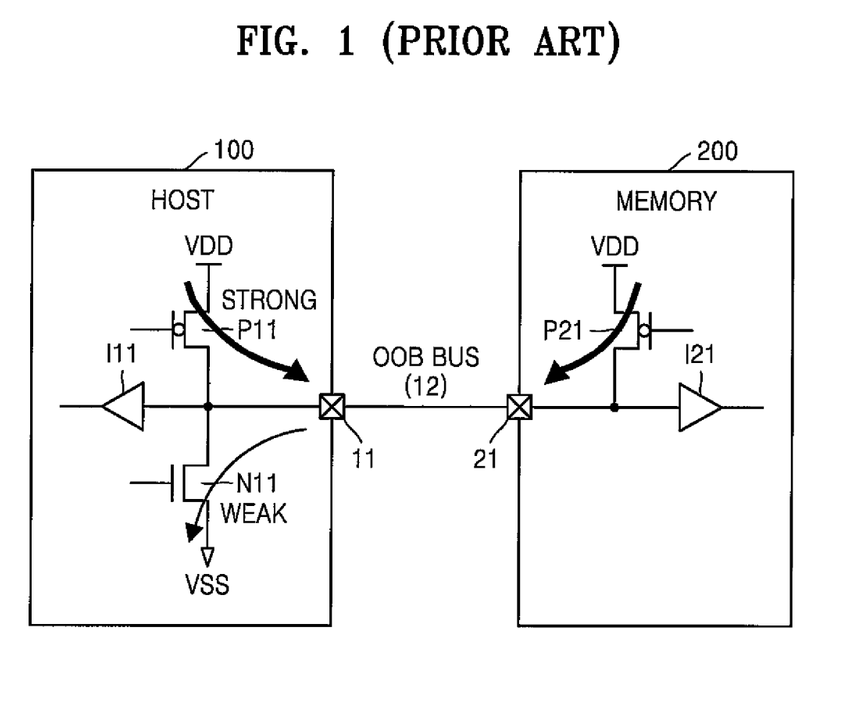
FIG. 1 is a schematic diagram of a bidirectional pulse width modulation (PWM) communication system, according to the prior art.
Figure 2A:
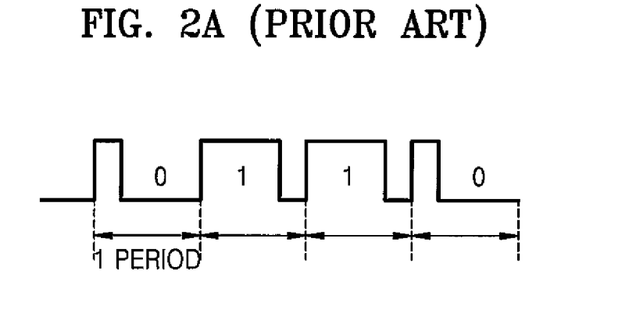
FIG. 2A is a waveform diagram illustrating data protocol when data is written to a memory device from a host using the bidirectional PWM communication method, according to the prior art.
Figure 2B:
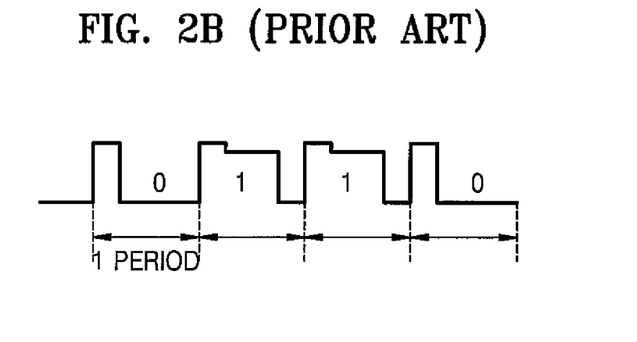
FIG. 2B is a waveform diagram illustrating data protocol when data is read from a memory device to a host using the bidirectional PWM communication method, according to the prior art.

FIG. 1 is a schematic diagram of a bidirectional PWM communication system, according to the prior art. FIG. 2A is a waveform diagram illustrating data protocol when data is written to a memory device from a host using the bidirectional PWM communication method, according to the prior art. FIG. 2B is a waveform diagram illustrating data protocol when data is read from the memory device to the host using the bidirectional PWM communication method, according to the prior art.

Referring to FIGS. 1, 2A and 2B, a memory device 200 is coupled to a host 100. The host 100 may be or include, for example, a memory controller. When data "0" is written to the memory device 200, a PMOS pull-up transistor P11 included in the host 100 is turned on for a relatively short period of time to make an OOB bus 12 connected to an OOB pin 11 of the host 100 have a logic high level. Subsequently, an NMOS pull-down transistor N11 included in the host 100 is turned on for a relatively long period of time to make the OOB bus 12 have a logic low level.

When data "1" is written to the memory device 200 from the host 100, the PMOS pull-up transistor P11 of the host 100 is turned on for a relatively long period of time to make the OOB bus 12 become logic high, and then the NMOS pull-down transistor N11 of the host 100 is turned on for a relatively short period of time to make the OOB bus 12 become logic low. When data is written to the memory device 200 from the host 100, a PMOS pull-up transistor P21 included in the memory device 200 is continuously maintained in turned off state.

When data "0" is read from the memory device 200 to the host 100, the PMOS pull-up transistor P11 of the host 100 is turned on for a relatively short period of time such that an OOB bus 12 becomes logic high, and then the NMOS pull-down transistor N11 included in the host 100 is turned on for a relatively long period of time such that the OOB bus 12 becomes logic low. At this time, the PMOS pull-up transistor P21 of the memory device 200 maintains the turned off state.

When data "1" is read from the memory device 200 to the host 100, the PMOS pull-up transistor P11 of the host 100 is turned on for a relatively short period of time such that an OOB bus 12 becomes logic high, and then the NMOS pull-down transistor N11 of the host 100 and the PMOS pull-up transistor P21 of the memory device 200 are turned on for a relatively long period of time. In this case, pull-down strength (current driving capability) of the PMOS pull-up transistor P21 of the memory device 200 is stronger than that of the NMOS pull-down transistor N11 of the host 100, and thus the OOB bus 12 becomes logic high.

Figure 3:
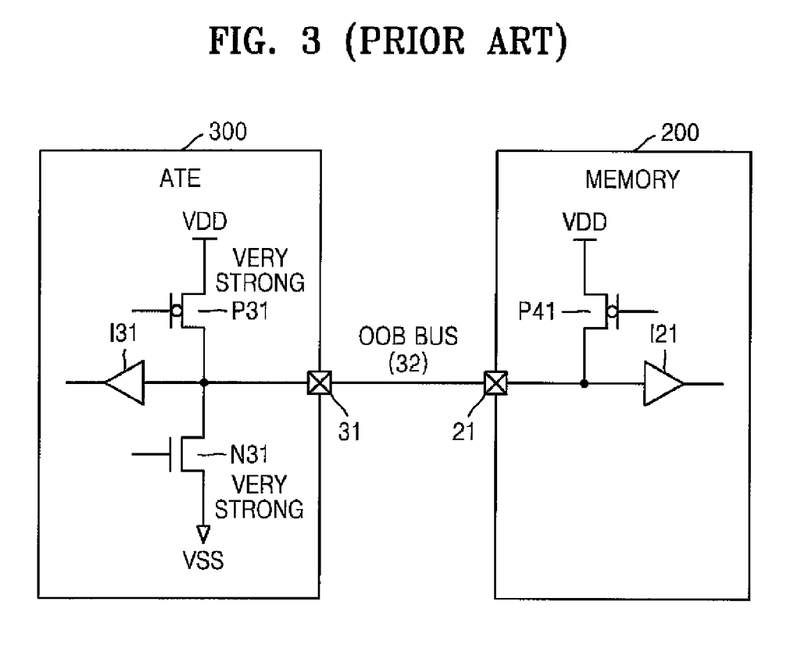
FIG. 3 is a schematic diagram a memory device configured to perform bidirectional PWM communication coupled to automatic test equipment (ATE), according to the prior art.

FIG. 3 is a schematic diagram of a memory device 200 configured to perform bidirectional PWM communication coupled to Automatic Test Equipment (ATE) 300, according to the prior art. To test the memory device 200, an OOB pin 21 of the memory device 200 is connected to an OOB pin 31 of the ATE 300 through an OOB bus 32. A PMOS pull-up transistor P31, an NMOS pull-down transistor N31 and an input buffer I31 of the ATE 300 respectively correspond to the PMOS pull-up transistor P11, the NMOS pull-down transistor N11 and an input buffer I11 of the host 100 illustrated in FIG. 1.

In the ATE 300, the pull-down strength of the NMOS pull-down transistor N31 is very strong. Accordingly, when data "1" is read from the memory device 200 to the ATE 300, charges of the OOB bus 32 are discharged through the NMOS pull-down transistor N31 of the ATE 300 even when the PMOS pull-up transistor P21 of the memory device 200 is turned on, and thus it is difficult to maintain the OOB bus 32 at logic high.

Furthermore, it is difficult to test the high-speed memory device 200 using the existing low-speed ATE 300.

SUMMARY OF THE INVENTION

The present invention provides a high-speed memory device that can be easily tested using the existing low-speed Automatic Test Equipment (ATE). In an embodiment of the invention, a memory device includes two channels. During normal communications with a host, one channel is used for bi-directional communications with a host. But during a test mode, a first channel is used to communicate with the ATE in one direction, and a second channel is used to communicate with the ATE in the opposite direction. The present invention also provides a memory module and a method for controlling the high-speed memory device.

One embodiment of the invention provides a semiconductor memory device that includes: a first input/output pin; a second input/output pin; and a memory core coupled to the first and second input/output pins, the semiconductor memory device configured to perform bi-directional communication between the memory core and a host through one of the first and second input/output pins in a normal mode, the semiconductor memory device configured to communicate from test equipment to the memory core through the first input/output pin in a test mode, the semiconductor memory further configured to communicate from the memory core to the test equipment through the second input/output pin in the test mode.

Another embodiment of the invention provides a memory module that includes: a substrate; and a plurality of memory devices assembled on the substrate, each of the memory devices having a first channel and a second channel, each of the plurality of memory devices configured to use a selected one of the first channel and the second channel for bi-directional communications with a host during normal operations, each of the plurality of memory devices configured to use the first channel to receive communications from a test device in a test mode.

Another embodiment of the invention provides A method for controlling a memory device comprising: determining whether the memory device is in a normal mode or a test mode; if the device is in the normal mode, selecting one of a first channel and a second channel; and if the device is in the normal mode, configuring the selected channel for bi-directional communications with a host.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

A memory device according to an embodiment of the present invention includes both an Out of Band (OOB) pin and a mirrored OOB pin. In embodiments of the invention, a memory device can perform bidirectional communication with the host 500 using either the OOB pin or mirrored OOB pin in a normal operation. In a test mode, the memory device can communicate with the ATE 700 in one direction using the OOB pin and in another direction using the mirrored OOB pin. Thus high-speed memory devices can be easily tested using the existing low-speed ATE.

Figure 4:
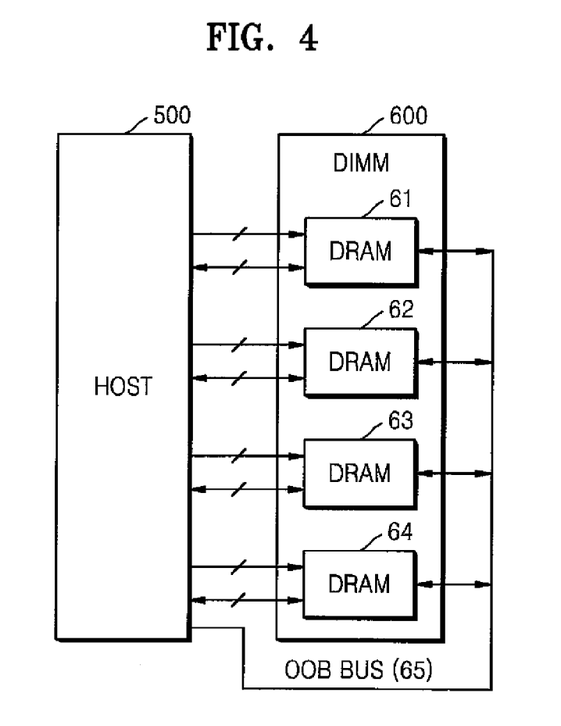
FIG. 4 is a block diagram of a host coupled to a Dual Inline Memory Module (DIMM), according to an embodiment of the present invention.

FIG. 4 is a block diagram of a host 500 coupled to a Dual In-line Memory Module (DIMM) 600, according to an embodiment of the invention. Each of the high-speed memory devices 61, 62, 63 and 64 of the DIMM 600 are configured to perform bidirectional communications with the host 500 over the OOB bus 65. In an alternative embodiment, each of the high-speed memory devices 61, 62, 63 and 64 of the DIMM 600 are configured to perform bidirectional communications with the host 500 over a mirrored OOB bus (not shown) instead of the OOB bus 65.

Figure 5:
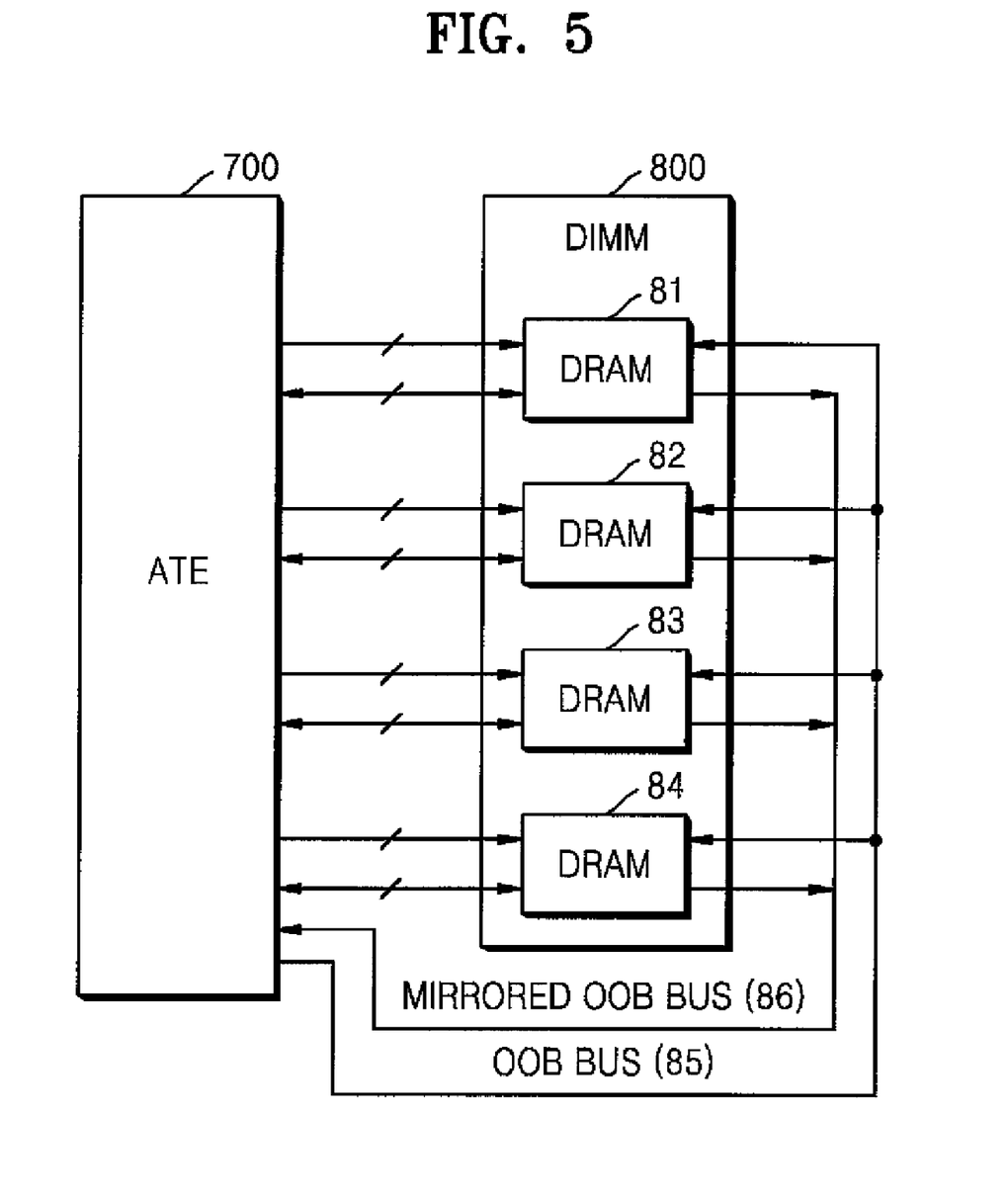
FIG. 5 is a block diagram of an ATE coupled to a Dual In-line Memory Module (DIMM), according to an embodiment of the present invention.

FIG. 5 is a block diagram of an ATE 700 coupled to a Dual In-line Memory Module (DIMM) 800, according to an embodiment of the invention. Each of the high-speed memory devices 81, 82, 83 and 84 of the DIMM 800 are configured to perform bidirectional communications with the ATE 700 using the OOB bus 85 and the mirrored OOB bus 86. More specifically, during the test configuration of FIG. 5, the OOB bus 85 and OOB bus 86 may each perform uni-directional communications in opposite directions. For instance, as shown, the OOB bus 85 may be used to communicate from the ATE 700 to the DIMM 800, and the mirrored OOB bus 86 may be used to communicate from the DIMM 800 to the ATE 700. Together, the OOB bus 85 and the mirrored OOB bus 86 perform bidirectional communications between the ATE 700 and the DIMM 800.

According to embodiments of the invention, the memory device packaging and the DIMM packaging are configured to facilitate the selective use of one or both OOB buses.

Figure 6:
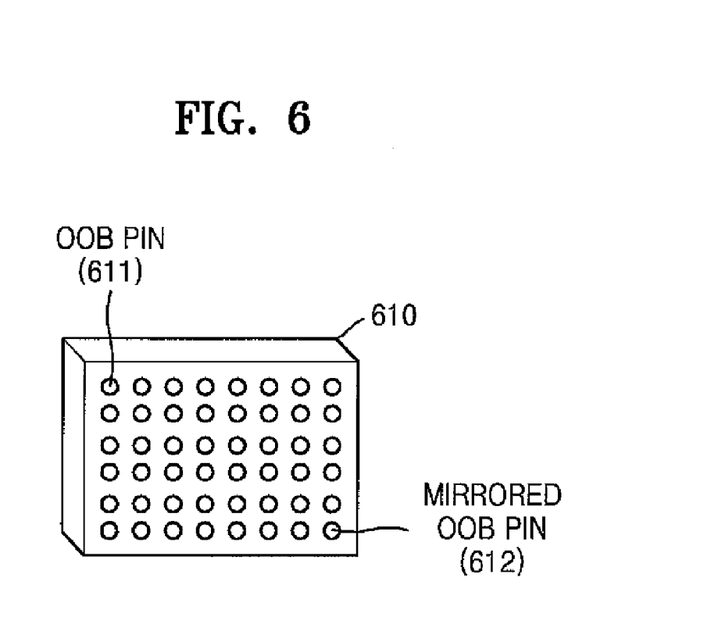
FIG. 6 is a perspective drawing of a high-speed memory device package, according to an embodiment of the present invention.

FIG. 6 is a perspective drawing of a high-speed memory device package, according to an embodiment of the present invention. The memory device package 610 illustrated in FIG. 6 includes a ball grid array (BGA) on a surface of the memory device package, the ball grid array having assignments for an OOB pin 611 and a mirrored OOB pin 612. Advantageously, the pin assignments may be arranged symmetrically on the BGA. In the package illustrated in FIG. 6, the OOB and mirrored OOB pin assignments are on opposite corners of the BGA. In normal use, either the OOB pin 611 or the mirrored OOB pin 612 are coupled to a host. During test, both the OOB pin 611 and the mirrored OOB pin 612 are coupled to the host.

The memory device packaging illustrated in FIG. 6 may be varied. For example, other package types such as Pin Grid Arrays (PGA's) or Small Outline Integrated Circuit (SOIC) packages may be used, according to design choice.

Figure 7:
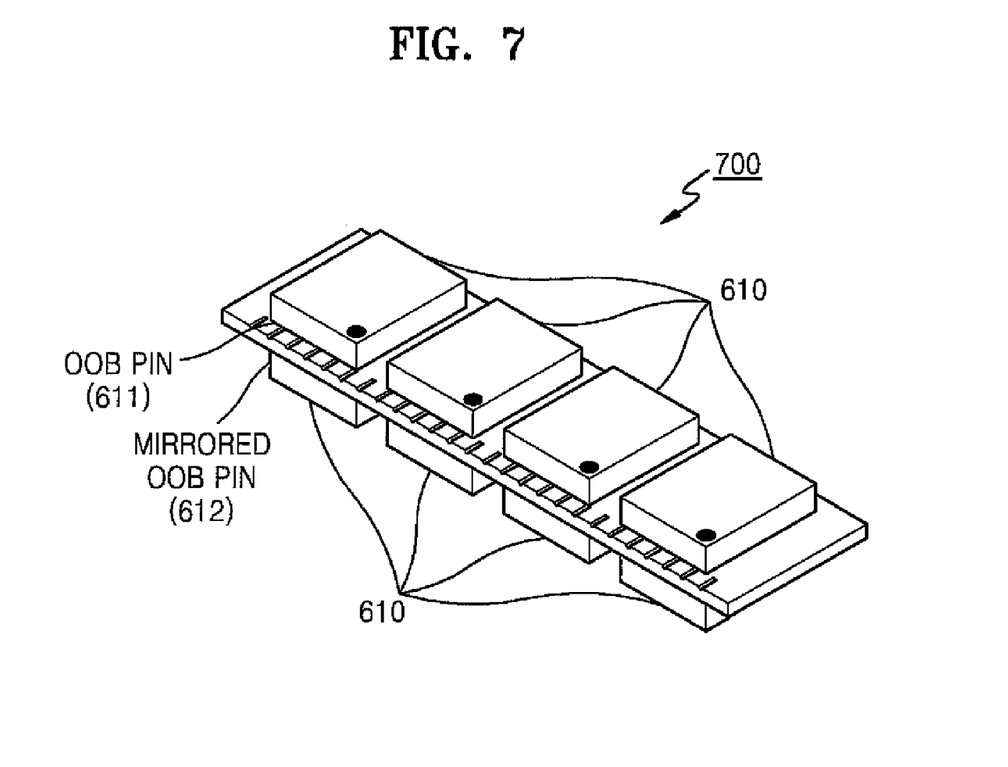
FIG. 7 is a perspective drawing of a memory module that includes the memory device package illustrated in FIG. 6, according to an embodiment of the invention.

FIG. 7 is a perspective drawing of a memory module that includes the memory device package illustrated in FIG. 6, according to an embodiment of the invention. The memory module 700 is a double-sided assembly that includes multiple memory device packages 610 attached to a printed circuit board (PCB) 710. As shown, the memory device packages 610 may be positioned such that the OOB pin 611 of a first memory device package on a first side of the PCB 710 is vertically aligned with the mirrored OOB pin 612 of a second memory device package on a second side of the PCB 710 when the PCB 710 is positioned horizontally.

The memory device packaging illustrated in FIG. 7 may be varied. For example, the quantity of memory device packages 610 included in the memory module 700 may be varied according to design choice. In addition, the memory device packages 610 could be mounted to other substrate types, for instance a ceramic substrate instead of the PCB 710.

The device and module packaging illustrated in FIGS. 6 and 7 may simplify routing on the PCB 710. Moreover, the illustrated packaging may simplify utilization of the OOB pins and mirrored OOB pins during memory device test and/or memory module test.

Figure 8:
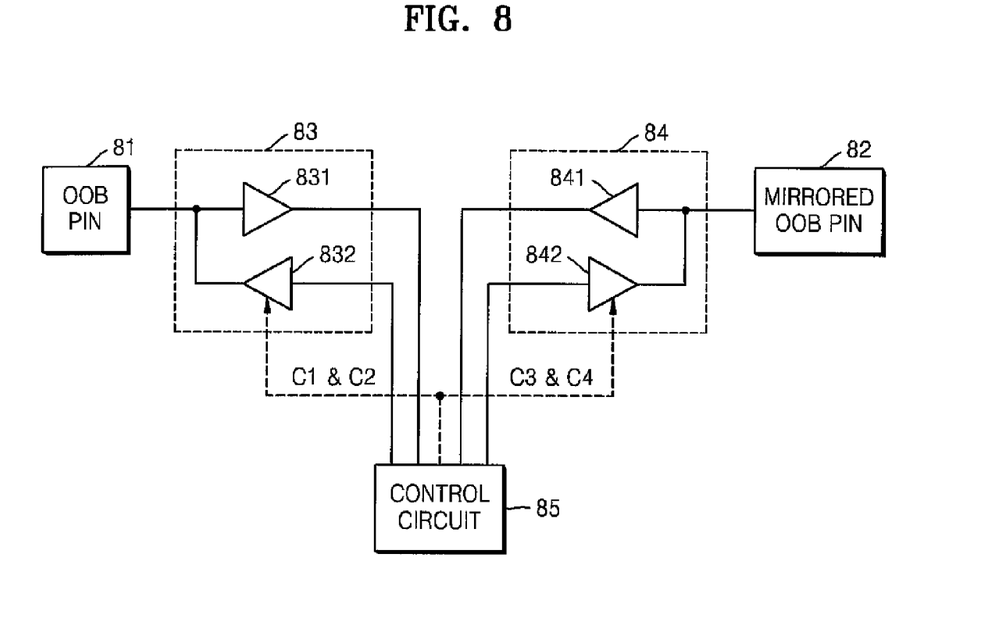
FIG. 8 is a block diagram of an input/output part of a high-speed memory device, according to an embodiment of the present invention.

FIG. 8 is a block diagram of an input/output part of a high-speed memory device, according to an embodiment of the present invention. Referring to FIG. 8, the high-speed memory device includes a first input/output buffer 83 configured to receive a first input signal or outputting a first output signal through an OOB pin 81, a second input/output buffer 84 configured to receive a second input signal or outputting a second output signal through a mirrored OOB pin 82, and a control circuit 85 configured to control the first input/output buffer 83 and the second input/output buffer 84.

In a normal operation, one of the first input/output buffer 83 and the second input/output buffer 84 performs bidirectional communication with the host 500 illustrated in FIG. 4 through the corresponding OOB pin. For instance, when the OOB pin 81 is connected to the host 500 in the normal operation, the first input/output buffer 83 is selected and carries out bidirectional communication with the host 500 through the OOB pin 81. Alternatively, when the mirrored OOB pin is connected to the host 500, the second input/output buffer 84 is selected and performs bidirectional communication with the host 500.

In a test mode, both the OOB pin 81 and the mirrored OOB pin 82 are connected to the ATE 700 illustrated in FIG. 5. The first input/output buffer 83 performs uni-directional communication with the ATE 700 through the OOB pin 81, and the second input/output buffer 84 also carries out uni-directional communication with the ATE 700 through the mirrored OOB pin 82. During the test mode, the OOB bus 85 and the mirrored OOB bus 86 communicate in opposite directions.

The control circuit 85 generates first and second control signals C1 and C2 for controlling the first input/output buffer 83, and third and fourth control signals C3 and C4 for controlling the second input/output buffer 84. The operations of the first and second input/output buffers 83 and 84 in the normal mode or test mode are determined by logic states of the first, second, third and fourth control signals C1, C2, C3 and C4.

More specifically, the first input/output buffer 83 includes a first input buffer 831 configured to buffer the first input signal input through the OOB pin 81 and output the first input signal to the inside of the memory device. The first input/output buffer further includes a first output buffer 832 configured to buffer and output the first output signal to the OOB pin 81 in response to the first and second control signals C1 and C2.

The second input/output buffer 84 includes a second input buffer 841 configured to buffer the second input signal input through the mirrored OOB pin 82 and output the second input signal to the inside of the memory device. The second input/output buffer 84 further includes a second output buffer 842 configured to buffer and output the second output signal to the mirrored OOB pin 82 in response to the third and fourth control signals C3 and C4.

Figure 9:
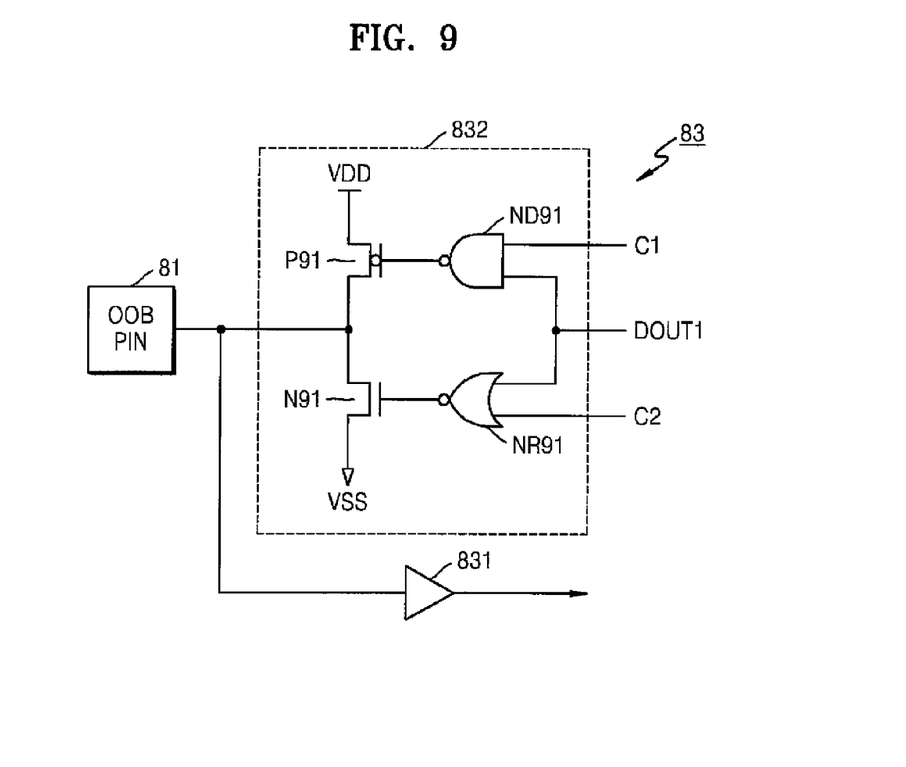
FIG. 9 is a circuit diagram of a first input/output buffer illustrated in FIG. 8.

FIG. 9 is a circuit diagram of the first input/output buffer 83 illustrated in FIG. 8. Referring to FIG. 9, the first output buffer 832 of the first input/output buffer 83 includes a NAND gate ND91, a NOR gate NR91, a PMOS pull-up transistor P91, and an NMOS pull-down transistor N91.

The NAND gate ND91 receives the first control signal C1 and a first output signal DOUT1 and performs a logic NAND operation on the received two signals. The NOR gate NR91 receives the second control signal C2 and the first output signal DOUT1 and executes a logic NOR operation on the received two signals. The PMOS pull-up transistor P91 is connected between a power supply voltage source VDD and the OOB pin 81 and controlled by the output signal of the NAND gate ND91. The NMOS pull-down transistor N91 is connected between the OOB pin 81 and a ground voltage source VSS and controlled by the output signal of the NOR gate NR91.

When the first control signal C1 has a logic value 0 and the second control signal C2 has a logic value 1 in the test mode, the NAND gate ND91 outputs 1 and the NOR gate NR91 outputs 0, and thus the PMOS pull-up transistor P91 and the NMOS pull-down transistor N91 are all turned off. In other words, the first output buffer 832 of the first input/output buffer 83 is not operated and the first input buffer 831 of the first input/output buffer 83 is operated when the first control signal C1 has a logic value 0 and the second control signal C2 has a logic value 1 in the test mode. That is, the first input/output buffer 83 functions as an input buffer.

When the first control signal C1 has a logic value 1 and the second control signal C2 has a logic value 0 in the test mode, the NAND gate ND91 and the NOR gate NR91 are operated as an inverter, and thus the first output buffer 832 is normally operated. That is, the first input/output buffer 83 functions as an output buffer. Accordingly, the first input/output buffer 83 can perform uni-directional communication with the ATE 700 through the OOB pin 81 in the test mode.

Both the first and second control signals C1 and C2 have a logic value 1 in the normal mode, and thus the NOR gate NR91 outputs 0 and the NMOS pull-down transistor N91 is turned off. Accordingly, the first input/output buffer 83 corresponds to the input/output buffer P21 and I21 of the memory device 200 illustrated in FIG. 1 and can perform bidirectional communication with the host 500 illustrated in FIG. 4 through the OOB pin 81.

Figure 10:
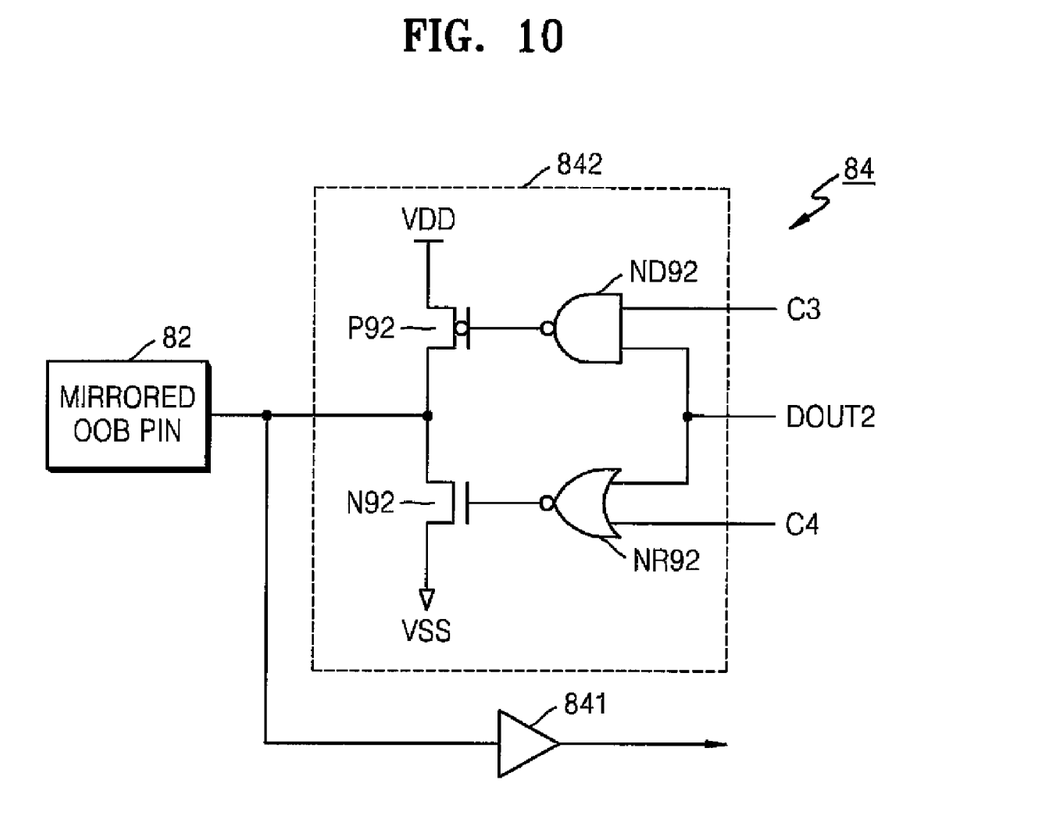
FIG. 10 is a circuit diagram of a second input/output buffer illustrated in FIG. 8.

FIG. 10 is a circuit diagram of the second input/output buffer 84 illustrated in FIG. 8. Referring to FIG. 10, the second input/output buffer 84 has the same configuration as the first input/output buffer 83 illustrated in FIG. 9. The second output buffer 842 of the second input/output buffer 84 includes an NAND gate ND92, a NOR gate NR92, a PMOS pull-up transistor P92 and an NMOS pull-down transistor N92.

The NAND gate ND92 receives the third control signal C3 and a second output signal DOUT2 and performs a logic NAND operation on the received two signals. The NOR gate NR92 receives the fourth control signal C4 and the second output signal DOUT2 and executes a logic NOR operation on the received two signals. The PMOS pull-up transistor P92 is connected between a power supply voltage source VDD and the mirrored OOB pin 82 and controlled by the output signal of the NAND gate ND92. The NMOS pull-down transistor N92 is connected between the mirrored OOB pin 82 and a ground voltage source VSS and controlled by the output signal of the NOR gate NR92.

The operation of the second input/output buffer 84 is identical to the operation of the first input/output buffer 83 illustrated in FIG. 9 so that detailed explanation thereof is omitted.

Figure 11:
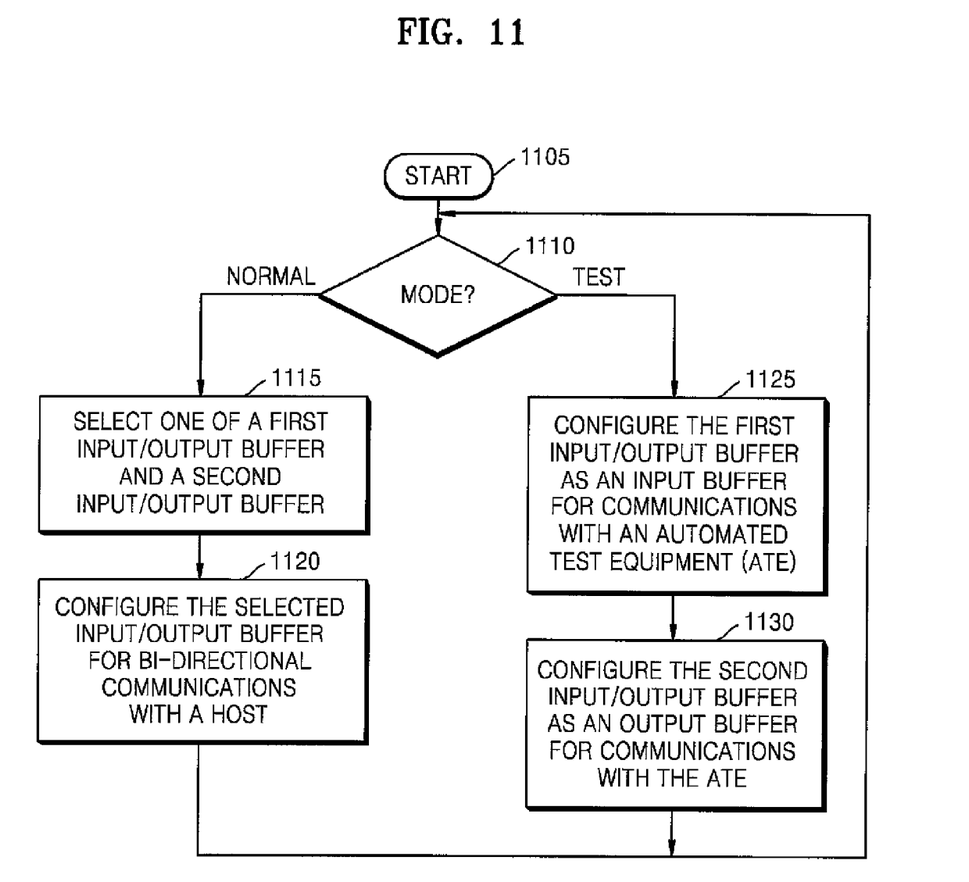
FIG. 11 is a flow diagram of a process for controlling a memory device, according to an embodiment of the invention.

FIG. 11 is a flow diagram of a process for controlling a memory device, according to an embodiment of the invention. As illustrated therein, after the process begins in step 1105, the process determines whether the memory device is in a normal mode or a test mode in conditional step 1110.

If the memory device is in a normal mode, then the process selects one of a first input/output buffer and a second input/output buffer in step 1115. For example, the process could select either input/output buffer 83 or input/output buffer 84. Then, in step 1120, the process configures the selected input/output buffer for bi-directional communications with a host.

If the memory device is in a test mode, then the process configures the first input/output buffer as an input buffer for communications with an ATE in step 1125. Then, in step 1130, the process configures the second input/output buffer as an output buffer for communications with the ATE.

The method illustrated in FIG. 11 and described above can be executed by the control circuit 85. Moreover, the control circuit 85 may be embodied in hardware, software, or a combination of hardware and software, according to design choice.

The method illustrated in FIG. 11 and described above can be broadened to include the application of a single bi-directional channel for communications with a host during the normal mode, and the application of two uni-directional channels for communications with an ATE or other test device during a test mode. By using two uni-directional communication channels during the test mode, overall communications bandwidth with the ATE or other test device is increased as compared to a single bi-directional channel. In embodiments of the invention, a first channel is associated with and OOB pin of a packaged memory device and a second channel is associated with a mirrored OOB pin of the packaged memory device.

As described above, the high-speed memory device that is configured to perform bidirectional communication according to the present invention can perform uni-directional communication with ATE through each of the OOB pin and mirrored OOB pin in a test mode. Accordingly, the high-speed memory device according to the present invention can be easily tested using the existing low-speed ATE.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
a first input/output pin;
a second input/output pin; and
a memory core coupled to the first and second input/output pins, the semiconductor memory device configured to perform bi-directional communication between the memory core and a host through one of the first and second input/output pins in a normal mode, the semiconductor memory device configured to communicate from test equipment to the memory core through the first input/output pin in a test mode, the semiconductor memory further configured to communicate from the memory core to the test equipment through the second input/output pin in the test mode.

2. The semiconductor memory device of claim 1, further comprising:
a first input/output buffer coupled to the first input/output pin; and
a second input/output buffer coupled to the second input/output pin.

3. The semiconductor memory device of claim 2, wherein the first input/output buffer comprises:
a first input buffer coupled to the first input/output pin; and
a first output buffer coupled to the first input/output pin.

4. The semiconductor memory device of claim 3, wherein the second input/output buffer comprises:
a second input buffer coupled to the second input/output pin; and
a second output buffer coupled to the second input/output pin.

5. The semiconductor memory device of claim 4, further comprising a controller coupled to the first output buffer and the second output buffer.

6. The semiconductor memory device of claim 5, the first output buffer being responsive to a first and second control signal output from the controller, the second output buffer being responsive to a third and fourth control signal output from the controller.

7. The semiconductor memory device of claim 6, wherein the first output buffer comprises:
a NAND gate, a first input of the NAND gate coupled to the memory core, a second input of the NAND gate coupled to receive the first control signal and;
a NOR gate, a first input of the NOR gate coupled to the memory core, a second input of the NOR gate coupled to receive the second control signal;
a PMOS pull-up transistor, a source of the PMOS pull-up transistor coupled to a power supply voltage source, a drain of the PMOS pull-up transistor coupled to and the first input/output pin, a gate of the PMOS pull-up transistor coupled to an output of the NAND gate; and
an NMOS pull-down transistor, a source of the NMOS pull-down transistor coupled to the first input/output pin, a drain of the NMOS pull-down transistor coupled to a ground voltage source, a gate of the NMOS pull-down transistor coupled to an output of the NOR gate.

8. The semiconductor of claim 7, wherein the first input of the NAND gate and the first input of the NOR gate are coupled to the memory core via the controller.

9. The semiconductor memory device of claim 6, wherein the second output buffer comprises:
a NAND gate, a first input of the NAND gate coupled to the memory core, a second input of the NAND gate coupled to receive the third control signal and;
a NOR gate, a first input of the NOR gate coupled to the memory core, a second input of the NOR gate coupled to receive the fourth control signal;
a PMOS pull-up transistor, a source of the PMOS pull-up transistor coupled to a power supply voltage source, a drain of the PMOS pull-up transistor coupled to and the second input/output pin, a gate of the PMOS pull-up transistor coupled to an output of the NAND gate; and
an NMOS pull-down transistor, a source of the NMOS pull-down transistor coupled to the second input/output pin, a drain of the NMOS pull-down transistor coupled to a ground voltage source, a gate of the NMOS pull-down transistor coupled to an output of the NOR gate.

10. The semiconductor of claim 9, wherein the first input of the NAND gate and the first input of the NOR gate are coupled to the memory core via the controller.

11. A memory module comprising:
a substrate; and
a plurality of memory devices assembled on the substrate, each of the memory devices having a first channel and a second channel, each of the plurality of memory devices configured to use a selected one of the first channel and the second channel for bi-directional communications with a host during normal operations, each of the plurality of memory devices configured to use the first channel to receive communications from a test device in a test mode.

12. The memory module of claim 11, each of the plurality of memory devices configured to use the second channel to transmit communications to the test device in the test mode.

13. The memory module of claim 11 wherein each of the memory devices includes a Ball Grid Array (BGA).

14. The memory module of claim 13, the first channel being associated with an Out of Band (OOB) pin, the second channel being associated with a mirrored OOB pin.

15. The memory module of claim 14, the OOB pin being in a first corner of the BGA, the mirrored OOB pin being in a second corner of the BGA, the second corner being opposite the first corner.

16. The memory module of claim 11 wherein the substrate is a double-sided substrate, a first portion of the plurality of memory devices being assembled to a first side of the double-sided substrate and a second portion of the plurality of memory devices being assembled to a second side of the double-sided substrate.

17. A method for controlling a memory device comprising:
    determining whether the memory device is in a normal mode or a test mode;
    if the device is in the normal mode, selecting one of a first channel and a second channel; and
    if the device is in the normal mode, configuring the selected channel for bi-directional communications with a host.

18. The method of claim 17 wherein the first channel is associated with a first input/output buffer, the second channel is associated with a second input/output buffer, and configuring the selected channel includes outputting at least one control signal to at least one of the first and second input/output buffers based on the selected channel.

19. The method of claim 17, further comprising:
    if the memory device is in the test mode, configuring the first channel to receive first signals from a test device; and
    if the memory device is in the test mode, configuring the second channel to transmit second signals to the test device.

20. The method of claim 19 wherein the first channel is associated with a first input/output buffer, the second channel is associated with a second input/output buffer, configuring the first channel includes outputting at least one control signal to the first input/output buffer, and configuring the second channel includes outputting at least one other control signal to the second input/output buffer.

* * * * *